United States Patent [19]

Roemer et al.

[11] Patent Number: 4,879,515
[45] Date of Patent: Nov. 7, 1989

[54] DOUBLE-SIDED RF SHIELD FOR RF COIL CONTAINED WITHIN GRADIENT COILS OF NMR IMAGING DEVICE

[75] Inventors: Peter B. Roemer; William A. Edelstein, both of Schenectady, N.Y.

[73] Assignee: General Electric Company, Schenectady, N.Y.

[21] Appl. No.: 288,344

[22] Filed: Dec. 22, 1988

[51] Int. Cl.⁴ .............................................. G01R 33/20
[52] U.S. Cl. .................................... 324/318; 324/322
[58] Field of Search .............. 324/300, 307, 309, 318, 324/319, 320, 322; 333/219, 222

[56] References Cited

U.S. PATENT DOCUMENTS

| | | | |
|---|---|---|---|
| 4,621,237 | 11/1986 | Timms | 324/322 |
| 4,642,569 | 2/1987 | Hayes et al. | 324/318 |
| 4,668,915 | 5/1987 | Daubin | 324/309 |
| 4,771,256 | 9/1988 | Laskaris | 324/320 |
| 4,791,370 | 12/1988 | Mackinnon | 324/318 |

Primary Examiner—Michael J. Tokar
Attorney, Agent, or Firm—Geoffrey H. Krauss; James C. Davis, Jr.; Marvin Snyder

[57] ABSTRACT

A double-sided RF shield, for use between a set of gradient coils and an RF coil, is a hollow member formed of a conductor-dielectric-conductor laminate. Each conductor is a sheet divided into first and second opposed half-cylinders, each having a plurality of conductive streamline loop portions with a series of nonconductive cut lines formed therebetween, with each of the cut lines being parallel to the RF current. Each of the loops is separated into a "C"-shaped conductive portion along at least one "radial" line cut in each half-cylinder. The cut lines are substantially opposite to one another on opposite surfaces of the half-cylinders, to form a loop with a pair of series capacitances of maximized value, which shield the RF current, yet pass gradient magnetic fields in all three mutually orthogonal directions of a Cartesian coordinate system.

4 Claims, 4 Drawing Sheets

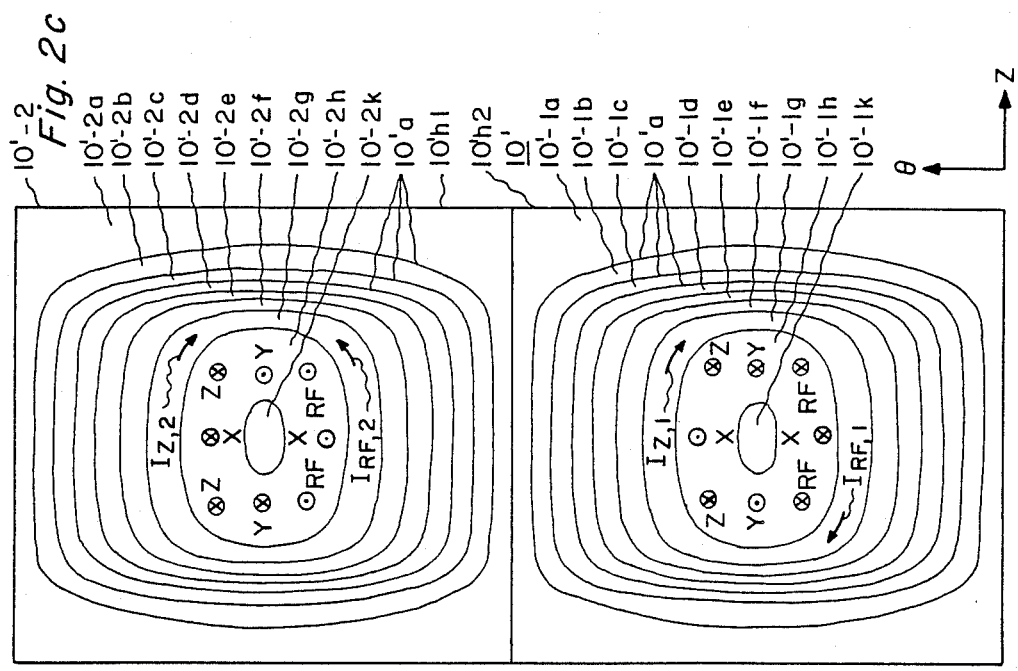
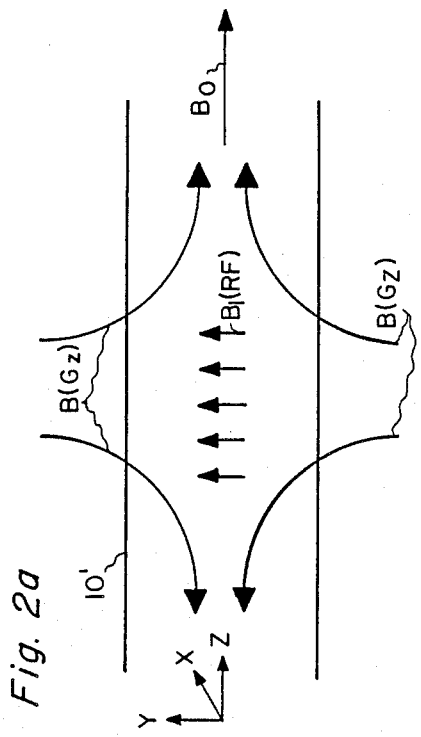
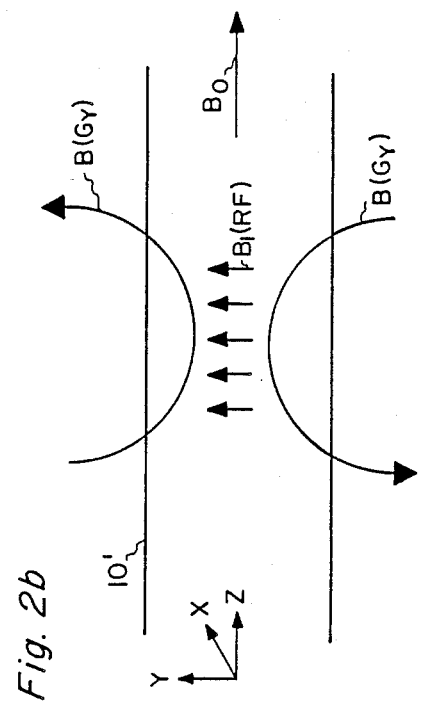

DOUBLE-SIDED RF SHIELD FOR RF COIL CONTAINED WITHIN GRADIENT COILS OF NMR IMAGING DEVICE

BACKGROUND OF THE INVENTION

The present invention relates to radio-frequency (RF) shields and, more particularly, to a novel double-sided RF shield for placement between an RF body coil and a set of gradient coils in a nuclear-magnetic resonance (NMR) imaging device.

An NMR imaging device typically utilizes a set of three gradient coils to obtain spatially-selective information. Each of the these gradient coils generally contain a multiplicity of turns of conductive wire, with total lengths of up to several hundred meters. RF fields lose a significant portion of their energy if these fields impinge upon the conductive wires of the gradient coils; while the loss mechanism is not fully understood, it is probably associated with high current resonances exciting the gradient structure and producing associated high losses. Any RF power loss, in the gradient coils or otherwise, appears as a lowering of the quality factor Q of the RF coil and consequently appears as a lowering of the signal-to-noise ratio (SNR) attainable in the imaging device. Accordingly, it is highly desirable to prevent penetration of the RF field into the gradient coils; a shield is typically placed between the RF coil and the gradient coils. The RF shield must, however, be substantially transparent to the gradient magnetic fields and therefore must prevent inducement of any significant shield currents at gradient frequencies (typically less than about 10 KHz.) to prevent temporally-dependent and/or spatially-dependent magnetic field inhomogeneities from appearing and having an adverse affect on the resulting image.

Hitherto, the most commercially used RF shield in a medical NMR imaging device has been a double-sided shield using a copper-dielectric-copper laminate sheet having an empirically obtained overlapping patchwork pattern etched into the copper sheets on both sides of the laminate. The patchwork pattern is generally a poor approximations to the current paths in a solid shield, so that induced currents are forced to flow through the shield dielectric at several locations. Thus, the current path contains the equivalent of several capacitors in series and total path capacitance is undesirable relatively small. It is desirable to not only provide a highly-effective, double-sided RF shield for placement between an RF coil and a set of gradients coils, but also to provide such an RF coil in which the shield current flows through as large an equivalent shield capacitor as possible.

BRIEF DESCRIPTION OF THE INVENTION

In accordance with the invention, a double-sided RF shield, for use between a generally cylindrical set of gradient coils and a generally cylindrical RF coil, is a hollow cylindrical member formed of a conductor-dielectric-conductor laminate, each of which conductors is a sheet divided into first and second opposed half-cylinders, each having a plurality of conductive streamline loop portions with a series of nonconductive cut lines formed therebetween, with each of the cut lines being parallel to the RF current and of a generally oval shape. Each of the shield conductor loops is separated into a generally "C"-shaped conductive portion along at least one "radial" line cut in each half-cylinder; the cut lines are substantially opposite to one another on opposite surfaces of the half-cylinders, to form a loop with a pair of series capacitances of maximized value, which shield the RF current, yet pass gradient magnetic fields in all three mutually orthogonal directions of a Cartesian coordinate system.

Accordingly, it is an object of the present invention to provide a novel double-sided RF shield for placement between an RF body coil and a gradient coil set in a NMR imaging device.

This and other objects of the present invention will become apparent reading the following detailed description, when considered in conjunction with the drawing.

BRIEF SUMMARY OF THE DRAWINGS

FIGS. 2a and 2b are illustrations of the relative directions of RF and gradient magnetic fields intercepted by the cylindrical RF shield of the present invention;

FIG. 2c is a graphical illustration of the shield current contours, and of the RF and gradient magnetic fields traversing the shield cylinder.

DETAILED DESCRIPTION OF THE INVENTION

Figure 1:
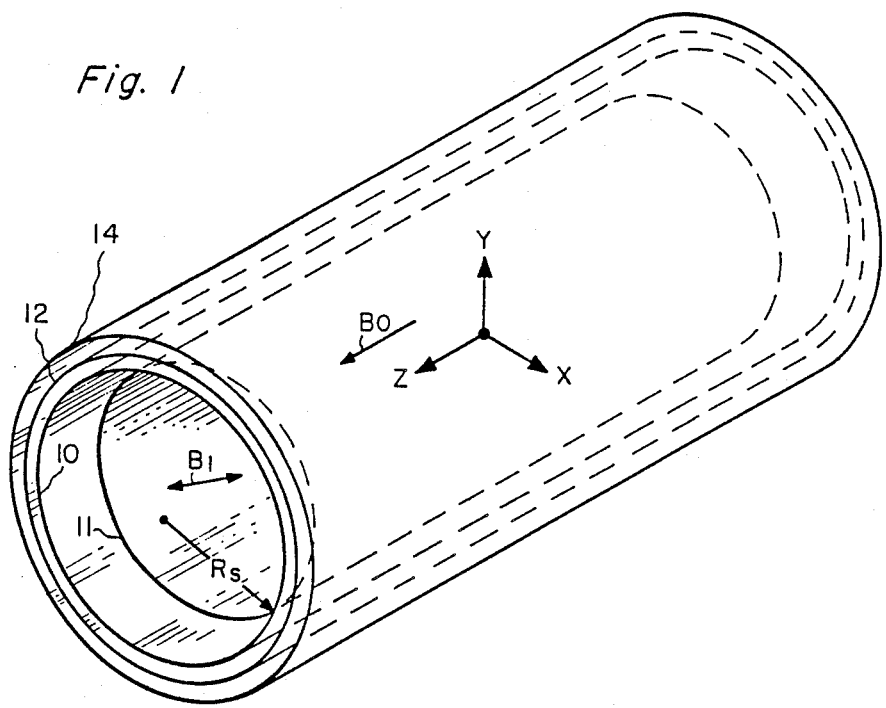
FIG. 1 is a perspective view of an RF whole body coil, gradient coil set and RF shield of the present invention, within the bore of a NMR imaging device magnet.

Referring initially to FIG. 1, a radio-frequency (RF) shield 10, in accordance with the present invention, is a hollow cylindrical conductive member situated between a RF whole body coil 11 and a set of magnetic field gradient coils 12, within the bore 14 of a magnet (not shown) in a nuclear magnetic resonance (NMR) imaging device. By convention, the static main magnetic field $B_0$ of the main NMR system magnet (produced by the magnetic means formed about bore 14) is aligned with the Z axis of a Cartesian coordinate system. The RF coil 11 forms an RF magnetic field $B_1$, within the coil 11 bore responsive to a RF signal. Field $B_1$ is typically in the X-Y plane. A significant RF magnetic field is also present outside of coil 11, and, as is well known in the art, will impinge upon gradient coils 12 unless the RF shield 10 is present and effectively operates as an RF short circuit. Shield 10 must be substantially transparent to the magnetic fields from gradient coils 12, allowing those gradient magnetic fields to enter into the bore of RF coil 11 and place spatial-encoding information upon the volume therein.

Figure 1A:
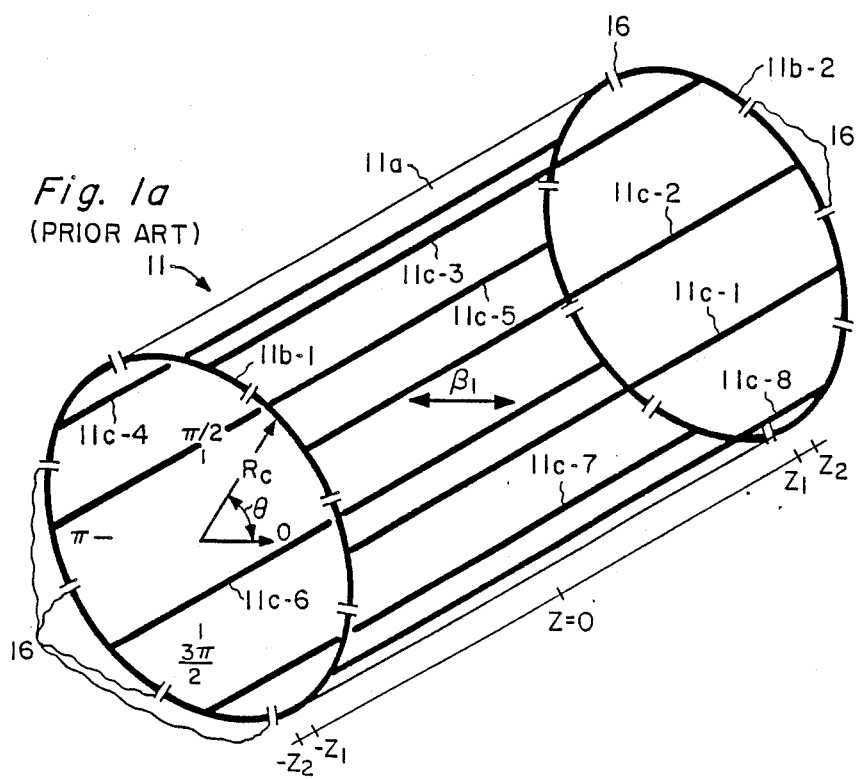
FIG. 1a is a schematic perspective view of one form of known whole body RF coil, and useful in appreciating the present invention.
Figure 1B:
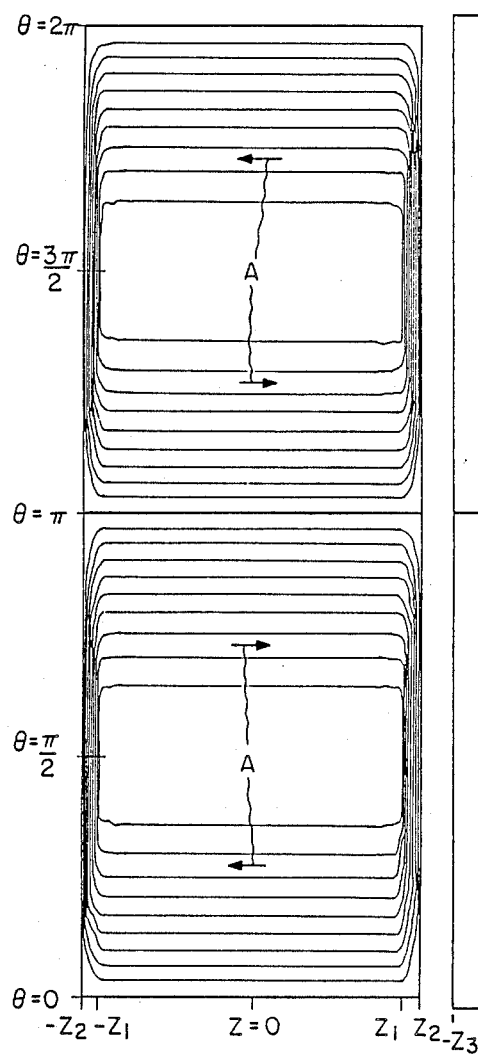
FIG. 1b is a graphic illustration of the current distribution contours in the RF coil of FIG. 1a, and useful in appreciating aspects of the present invention.

A typical whole body RF coil 11 is shown in FIG. 1a; this high-pass "birdcage" coil, formed upon a cylindrical base 11a of insulative material, comprises first and second spaced-apart end rings 11b-1 and 11b-2, each having a plurality of conductive segments (here, 8 segments) joined to one another by capacitive elements 16.

Each of the end rings $11b$ is thus substantially in the X-Y plane, as is the $B_1$ RF field produced. A like number of axial conductors $11c$ (here, eight conductors $11c$-1 through $11c$-8) are used. Each conductor extends in the Z direction between one of the conductive segments of first end ring $11b$-1 and a like-positioned conductive segment of the second conductive end ring $11b$-2. Thus, a first elongated conductive element $11c$-1 is positioned at an angle $\theta = 0$ and each of the remaining seven elongated conductive members $11c$-2 through $11c$-8 are placed at successively greater angles around the periphery. Because of the cylindrical symmetry of the antenna coil, the RF magnetic fields and currents are analyzed utilizing cylindrical coordinates, of the form R, , Z, where $\theta$ is the angle of revolution with respect to that plane formed through the Z axis and the first conductive member $11c$-1. The axial center of coil 11 is placed at the Z=0 coordinate, and it is assumed that the birdcage coil currents are confined to a very thin layer and tend to flow through the areas of the end rings, defined by inner end ring dimension $Z_1$ and outer end ring dimension $Z_2$. The assumed coil distribution contours, parallel to the lines of current flow, are shown in FIG. $1b$, for an unwrapped coil laid flat and having a single excited mode. The separations between contours are equally spaced in current, and the current flow in the direction of arrows A.

Referring now to FIG. $1c$, we determine the shield currents $I_S$ on each of the interior or exterior conductive sheet, of a double-sided shield member, by first calculating the RF magnetic currents flowing in a solid conductive cylindrical shield member $10'$ which has been unwrapped as shown. It will be seen that the Z dimension of the shield extends from $-Z_3$ to $+Z_3$, where the total shield length $2Z_3$ is greater than the RF coil total length $2Z_2$. The circumferential width of the RF shield in the orthogonal ("$\theta$") dimension is greater than the associated width of the unwrapped RF coil (as shown in FIG. $1b$) due to the greater radius $R_s$ of the shield cylinder, with respect to the radius $R_c$ of the coil 11 cylinder. Since the RF coil currents are assumed to be confined to a very thin layer, we can then Fourier decompose these currents and match them to the separable solutions of the Laplace equations, in cylindrical coordinates, for the RF shield sheet $10'$ and obtain expressions for the RF magnetic fields. With only a single mode excited in the RF coil 11, the resonant frequency current is substantially a sinusoidal distribution in the axial bars and thus produces a highly uniform magnetic field $B_1$ in the central RF coil volume. The RF coil 11 surface current densities J are approximately given by $$J_\theta(\theta,z) = \frac{I}{Z_2 - Z_1} \cdot \begin{cases} 0 & |z| < Z_1 \\ -\sin\theta & Z_1 < z < Z_2 \\ \sin\theta & -Z_2 < z < -Z_1 \\ 0 & |z| > Z_2 \end{cases} \quad (1)$$

$$J_z(\theta,z) = \frac{I}{R_c(Z_2 - Z_1)} \cdot \begin{cases} -(Z_2 - Z_1)\cos\theta & |z| < Z_1 \\ -(Z_2 - |z|)\cos\theta & Z_1 < |z| < Z_2 \\ 0 & |z| > Z_2 \end{cases} \quad (2)$$

Proceeding with the determination of the RF coil surface current densities J, the central section of the coil has sinusoidal current densities which flow in the axial direction and are matched to currents in the end rings, so as to be divergence-free at the interface therebetween. The angular components of the end ring currents are assumed to be uniform in the Z direction and at a maximum value when the end rings carry a total current I. Instead of manipulating both components of the surface current, we express the surface currents in terms of a stream function $S(\theta,z)$, which is related to the surface current by $$J_\theta(\theta,z) = -\frac{\partial}{\partial z} S(\theta,z) \quad (3)$$

$$J_z(\theta,z) = \frac{-1}{r} \frac{\partial}{\partial \theta} S(\theta,z) \quad (4)$$

By expressing the surface currents in terms of a stream function, the zero divergence of each surface current is guaranteed. The practical aspect of utilizing a stream function is that lines of constant stream S are contours formed parallel to the current flow. The RF shield current flow patterns are determined utilizing this parallel contour rule. Fourier decomposition of the currents in equations (1) and (2) results in the following birdcage coil stream function $$S_c(\theta,z) = \int_0^\infty A(k)\sin\theta\cos(kz)dk \quad (5)$$

where $A(k)$ is given by the function $$A(k) = \frac{2I(\cos(kZ_1) - \cos(kZ_2))}{\pi k^2(Z_2 - Z_1)} \quad (6)$$

Matching these currents to the separable solutions of Laplace's equation, in cylindrical coordinates, yields the following result for the interior and exterior magnetic scalar potentials $\Phi$ $$\phi(r,\theta,z) = \quad (7)$$

$$\begin{cases} \int_0^\infty A(k)kR_c K_1'(kR_c)I_1(kr)\sin\theta\cos(kz)dk & r < R_c \\ \int_0^\infty A(k)kR_c I_1'(kR_c)K_1(kr)\sin\theta\cos(kz)dk & r > R_c \end{cases}$$

where $I_1$ and $K_1$ are modified Bessel functions respectively of the first and second kind. The magnetic flux density B, in terms of the scalar potential $\Phi$, is given by $$\mathbf{B} = -\mu_0 \nabla \Phi \quad (8)$$

Placement of the RF coil 11 in a solid conductive shield 10 must result in zero external field. By superposition, this corresponds to currents, flowing on the inner surface of the shield, whose streamlines $S_s$ are given by the shield streamline function $S_s(\theta,z)$, which is $$S_s(\theta,z) = -\int_0^\infty A(k) \frac{R_c I_1'(kR_c)}{R_s I_1'(kR_s)} \sin\theta\cos(kz)dk \quad (9)$$

Figure 1C:
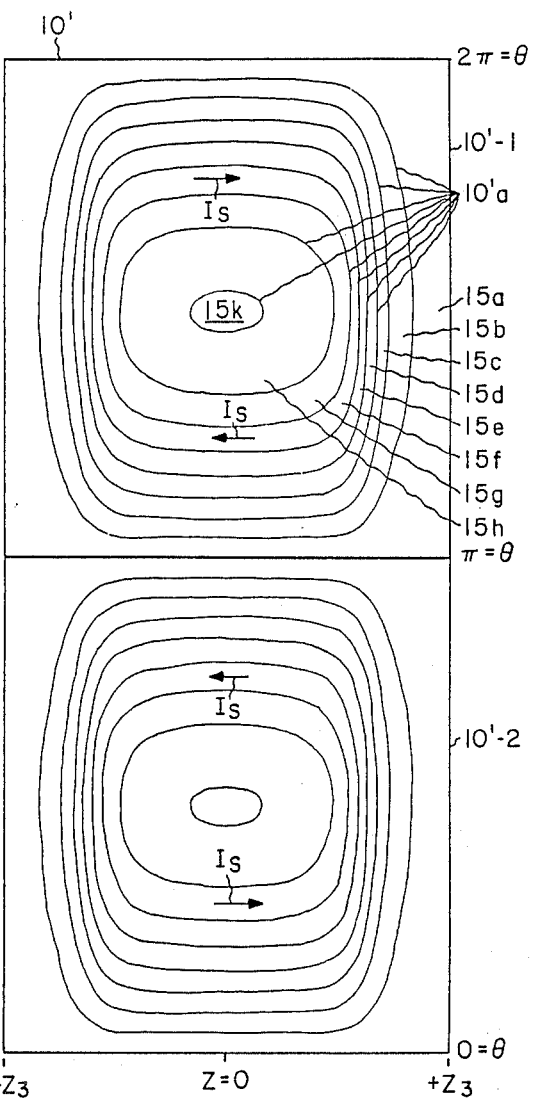
FIG. 1c is a graphical illustration of the shield currents flowing in a RF shield in accordance with the principles of the present invention.

Contours of constant $S_s$ are parallel to the RF currents induced in the shield and the difference in value of two contours is numerically equal to the current flowing between them. FIG. 1c is a plot of the contours of equation (9), for equally spaced contours. In any RF shield 10′, conductive material is removed from areas where lines 10′a have been drawn and leave most of the conductor (e.g. copper) in place in the streamline contour portions 15 between the separating lines; by making nonconductive lines 10′a very thin, the RF shield currents $I_s$ are essentially unchanged in each half-cylinder 10′-1 and 10′-2 and a proper RF shield is provided. However, any currents which were induced, as by the gradient magnetic fields, to flow perpendicular to cuts 10a will no longer flow.

Differences are observable between the RF coil stream function $S_c$ of equation (5) and the RF shield stream function $S_s$ of equation (9); it is immediately evident that the signs of the stream functions are opposite, indicating that the shield currents are directionally opposite to the RF coil currents. If the shield radius $R_s$ is reduced toward $R_c$, so that the shield is brought closer to RF coil 11, the shield current strength and shape approach the RF coil current strength and shape. Conversely, if the shield radius $R_s$ is increased and the shield is moved away from the RF coil, the behavior of the Bessel functions ($I'_1(kr)$) are such that the larger values of k are preferentially attenuated and, since larger values of k correspond to the short spatial wavelengths, the current pattern in the RF shield is an image of the RF coil which has been passed through a filter to remove the high spatial frequencies.

Referring now to FIGS. 2a and 2b, the Z-direction field $B(G_z)$ and Y-direction field $B(G_y)$ are shown, with respect to the midplane of cylindrical shield 10′. The X-direction field $B(G_x)$, while not shown, is directed into and out of the plane of the drawing and has a shape substantially the same as, but orthogonal to, the Y-direction field in FIG. 2b. The RF magnetic field and the three gradient fields all have different field symmetries (i.e. are all orthogonal). The X and Y direction gradients $G_X$ and $G_Y$ will pass through contour-cut shield 10′ substantially without attenuation, although the Z-direction gradient $G_Z$ is attenuated to some degree. The field symmetries of the Rf and gradient coils are tabulated in the following table:

| COIL | ANGULAR SYMMETRY OF RADIAL MAGNETIC FIELD ($\theta$ dependence) | AXIAL SYMMETRY OF RADIAL MAGNETIC FIELD (Z dependence) |
| --- | --- | --- |
| X gradient | Cos $\theta$ | ODD |
| Y gradient | Sin $\theta$ | ODD |
| Z gradient | Constant | EVEN |
| RF mode 1 | Sin $\theta$ | EVEN |
| RF mode 2 | Cos $\theta$ | EVEN |

Referring to FIG. 2c, each of the streamline-cut conductive interior or exterior sheet 10′ of the shield has the various RF and gradient fields passing therethrough as shown. The "arrowpoint"-dot/"arrowtail"-cross convention is used to show the direction in which the field comes and goes. It will be seen that, in each shield sheet half-cylinder 10′h1 or 10′h2, there is no net flux from either the X-gradient $G_X$ or the Y-gradient $G_Y$, as each of these gradients pass in both directions through each of the conducting streamline portions 10′-1a through 10′-1h and 10′-1k or 10′-2a through 10′-2h and 10′-2k and are effective self-cancelling. Therefore, the X and Y gradients $G_X$ and $G_Y$ do not induce any shield currents $I_s$. As will be seen from FIGS. 2a and 2c, the Z gradient $G_Z$ passes twice through each shield half-cylinder of each sheet, but both passes are in the same direction; there is no self-cancellation but rather an additive effect and gradient $G_Z$ does link net flux with the shield loops and will produce shield current $I_Z$ components, as shown. Thus, the Z gradient-induced shield currents $I_{Z,1}$ and $I_{Z,2}$ flow in the same direction, such that the field produced by the Z gradient $G_Z$ reverses direction from the top half-cylinder 10′h1 to the bottom half-cylinder 10′h2 in either sheet. It will also be seen that non-cancelling RF field-induced currents $I_{RF,1}$ and $I_{RF,2}$ are induced and flow in opposite directions, as the RF gradient field $B_1$ does not reverse its direction across the cylinder.

Figure 3:
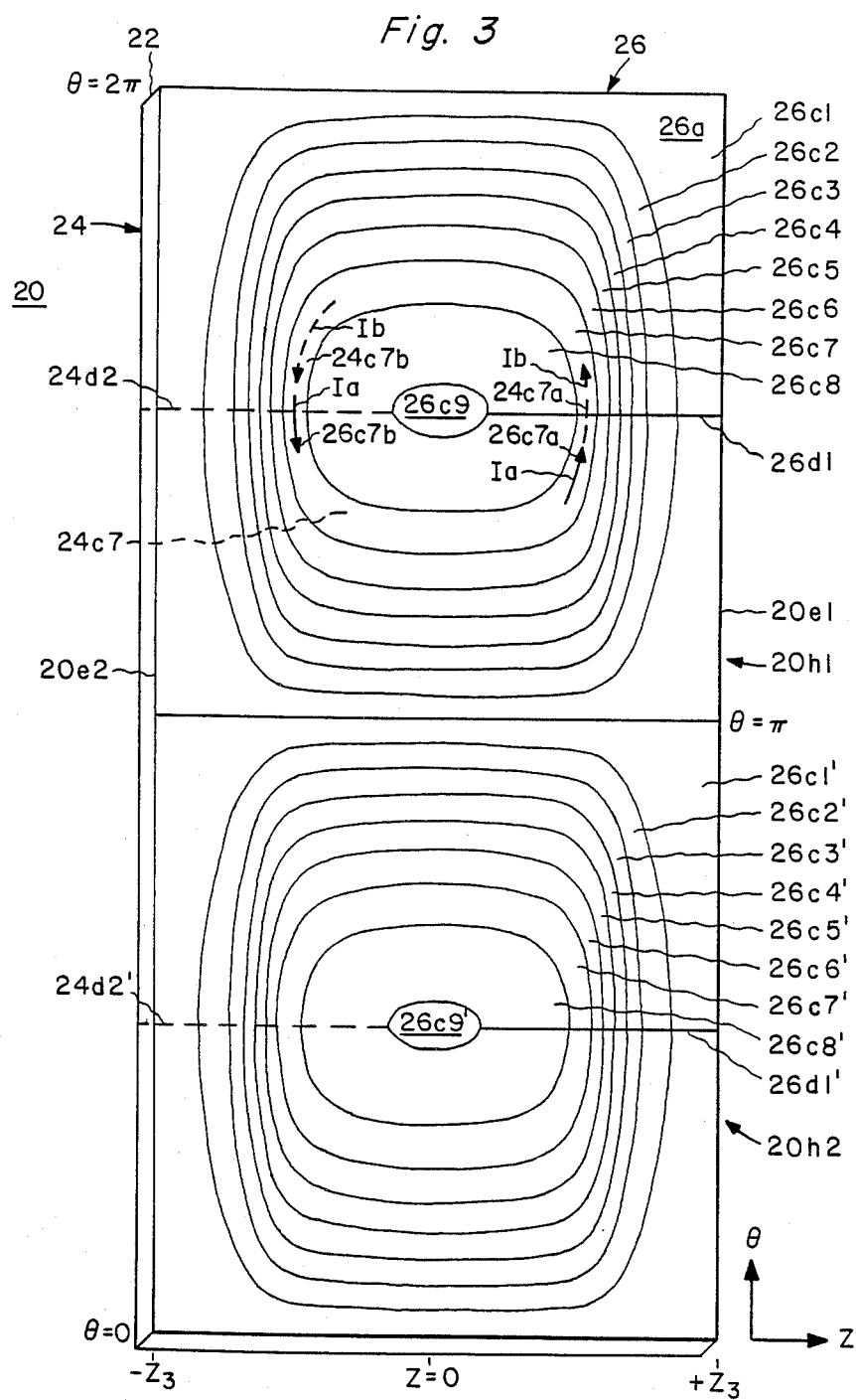
FIG. 3 is a plan view of a double-sided RF shield in accordance with the principles of the present invention.

In accordance with the invention, if each conductive loop 10′-1i and 10′-2i, where a≦i≦h, in each sheet is properly severed to form a loop in series with a pair of distributive capacitive elements of maximized value, then the Z-gradient interaction between the interior and exterior sheets in each half-cylinder can be nullified and any attenuation thereof reduced substantially to zero, while the X-gradient and Y-gradient self-cancellations and the RF shielding properties remain substantially unaffected. One presently-preferred embodiment of our RF shield 20 is, as shown in FIG. 3, formed of a conductor-dielectric-conductor laminate, with a dielectric sheet 22 having an exterior-surface-forming conductive sheet 24 on one surface thereof and an interior-surface-forming conductive sheet 26 on an opposite surface. Inside layer 26 and outside layer 24 can be formed of copper. When unwrapped, the shield inner conductor sheet 26 has the same cut contour portions 26c as the outer conductor sheet 24. Illustratively, each of the interior sheet (shown) and the exterior sheet (not shown) of a top half-cylinder 26h1 and a bottom half-cylinder 26h2 has contour portions 26c1–26c9/24-c1–24c9 (in top half 26h1) and 26c1′–26c9′/24c1′–24c9′ (in bottom half 26h2). The inside surface top half is cut by a cut line 26d1 and the inside surface bottom half is cut by a cut line 26d1′, each extending from the edge of innermost contour portion 26c9 or 26c9′ to a same first shield edge 26e1 and cutting all of contours 26c1–26c8 or 26c1′–26c8′ on the interior shield surface. The outer surface conductive sheet 24 is cut by a cut line 24d2 or 24d2′, extending from the edge of an inner contour (not shown, but, as explained above, the projection of contour 26c9 or 26c9′ onto the exterior shield surface) to the shield edge 26e2 opposite to the edge 26e1 to which cuts 26d1/26d1′ extend; cut lines 24d2/24d2′ cut exterior contours which coincide with interior contours 26c1–26c1′–26c8′. It will be seen that cut lines 26d1′ and 24d2′ can be reversed (to extend, respectively, to edges 20e2 and 20e1, respectively). In either configuration, induced RF currents, such as current Ia in an interior surface C-shaped cut loop portion 26c7 and current Ib in an exterior surface C-shaped cut portion 24c7 are the same current, flowing through a pair of series-connected capacitors: the induced current Ia flows toward the interior loop right end 26c8a, and, because of cut line 26d1, must flow through the dielectric and into the underlying part 24c7 a of the seventh contour of the exterior sheet as current Ib; this is the first capacitive transfer, due to a first effective capacitance. Current Ib now flows through exterior contour loop 24c7 towards the other end 24c7b thereof, and, due to cut line 24d2 in the exterior sheet, must flow through the dielectric again and into an "overlying" part 26c7b of the seventh interior upper contour; this is a second capacitive transfer, or a second effective capacitance, in series with the first capacitance at cut line 26d1. Because of the opposition of cut lines 26d1 and 24d2, or cut lines 26d1' and 24d2', each of the "arms" of the cut loop portions overlap to a maximum extent and the effective capacitances is maximized (maximum area of overlapping C-shaped cut loops), as is the equivalent single capacitance thereof.

While several presently preferred embodiments of the present invention are presented herein by way of explanation and illustration, many variations and modifications will now occur to those skilled in the art. It is our intent, therefore, to be limited only by the scope of the appending claims and not by the specific details and instrumentalities presented by way of explanation herein.

What we claim is:

1. A radio-frequency (RF) shield, for use interposed between a set of gradient coils and at least one RF coil in an NMR imaging device, comprises: a member of a laminate, having a dielectric sheet between a pair of conductive sheets, formed into a cylinder with a different one of said sheets forming a different one of interior and exterior conductive surfaces; each surface having opposed first and second half-cylinders with each half-cylinder having a like plurality of conductive streamline loop portions which are each defined by at least one nonconductive cut line etched through the sheet, between each pair of adjacent loop portions and parallel to RF current flow induced therein; and each half-cylinder having a single radial cut line separating each loop portion thereof into a generally C-shaped conductive loop portion and substantially opposite to the cut line in the same half-cylinder in the opposite one of the exterior and interior surfaces, to cause a pair of capacitive elements of maximized value to be present in series in each loop to provide a set of essentially short circuits for any RF current induced in either conductive sheet of the shield by the field of the at least one RF coil, while passing any field from said gradient coil set in substantially unattenuated manner.

2. The RF shield of claim 1, wherein the cut lines in each half-cylinder of one sheet are directed toward an identical shield end plane.

3. The RF shield of claim 1, wherein the cut lines in each half-cylinder of one sheet are directed toward a different shield end plane.

4. The RF shield of claim 1, wherein each cut line is substantially perpendicular to an end plane of the shield.

* * * * *